United States Patent
Bae et al.

(10) Patent No.: US 8,723,292 B2
(45) Date of Patent: May 13, 2014

(54) SILICON INTERPOSER INCLUDING BACKSIDE INDUCTOR

(75) Inventors: Hyun-Cheol Bae, Daejeon (KR);
Kwang-Seong Choi, Daejeon (KR);
Jong Tae Moon, Gyeryong-si (KR);
Jong-Moon Park, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 50 days.

(21) Appl. No.: 13/493,458

(22) Filed: Jun. 11, 2012

(65) Prior Publication Data

US 2013/0087884 A1    Apr. 11, 2013

(30) Foreign Application Priority Data

Oct. 6, 2011    (KR) .................. 10-2011-0102108

(51) Int. Cl.
*H01L 27/08* (2006.01)

(52) U.S. Cl.
CPC ....... *H01L 27/08* (2013.01); *H01L 2924/19042* (2013.01)
USPC ................. 257/531; 257/774; 257/E23.011; 257/E23.067; 438/667

(58) Field of Classification Search
CPC .................. H01L 28/10; H01L 2924/19042

USPC .................. 257/531, 774, E23.011, E23.067; 438/629, 667
See application file for complete search history.

(56) References Cited

U.S. PATENT DOCUMENTS

| 7,750,434 | B2 * | 7/2010 | Imaoka et al. ............... 257/531 |
| 8,237,269 | B2 * | 8/2012 | Tang et al. ................... 257/734 |
| 2005/0136634 | A1 * | 6/2005 | Savastiouk et al. ........... 438/597 |
| 2006/0170071 | A1 * | 8/2006 | Imaoka et al. ............... 257/531 |
| 2010/0213600 | A1 | 8/2010 | Lau et al. |
| 2012/0248569 | A1 * | 10/2012 | Jenkins et al. ............... 257/531 |
| 2013/0168809 | A1 * | 7/2013 | Yen et al. ..................... 257/531 |

FOREIGN PATENT DOCUMENTS

| KR | 10-2009-0071370 A | 7/2009 |
| KR | 10-2010-0082551 A | 7/2010 |
| KR | 10-2011-0019186 A | 2/2011 |

* cited by examiner

*Primary Examiner* — Allan R Wilson
(74) *Attorney, Agent, or Firm* — Rabin & Berdo, P.C.

(57) ABSTRACT

Disclosed is a silicon interposer that can reduce the entire area of a semiconductor package and increase the degree of integration by forming inductors at a lower part in addition to an upper part of a silicon substrate. The silicon interposer includes a silicon substrate, an upper inductor layer formed at the upper part of the silicon substrate and a lower inductor layer formed at the lower part of the silicon substrate.

4 Claims, 2 Drawing Sheets

SILICON INTERPOSER INCLUDING BACKSIDE INDUCTOR

CROSS-REFERENCE TO RELATED APPLICATIONS

This application is based on and claims priority from Korean Patent Application No. 10-2011-0102108, filed on Oct. 6, 2011, with the Korean Intellectual Property Office, the present disclosure of which is incorporated herein in its entirety by reference.

TECHNICAL FIELD

The present disclosure relates to a silicon interposer used in a semiconductor package, and more particularly, to a technology for forming an inductor on a lower surface of a silicon interposer.

BACKGROUND

In recent years, with miniaturization and integration of integrated circuits (ICs), a technology of manufacturing a single semiconductor package by stacking a plurality of semiconductor chips using a silicon interposer and a through silicon via (TSV) has been widely studied and developed. Particularly, a process technology of the silicon interposer is recognized as a technology which is absolutely necessary in the field of a 3D IC technology, and continuous research for increasing the degree of integration of a semiconductor device by integrating various passive devices on an interposer is being conducted.

FIG. 1 is a view schematically illustrating a silicon interposer in the related art.

Referring to FIG. 1, the silicon interposer in the related art includes a silicon substrate 101, a first dielectric layer 103, a first metal layer 105 and a second metal layer 107 which are formed at an upper part of the silicon substrate 101, a second dielectric layer 109 for separating the first metal layer 105 from the second metal layer 107 and a via 111 electrically connecting the first metal layer 105 and the second metal layer 107. An inductor is formed by electrically connecting the first metal layer 105, the second metal layer 107 and the via 111.

However, as shown in FIG. 1, the silicon interposer in the related art has a limitation in increasing the degree of integration of a semiconductor package because the inductor is formed only at an upper part of the interposer. In other words, there is a limitation in reducing a thickness of the interposer because the metal layer needs to have more than a predetermined thickness so as to obtain inductance of more than a predetermined value required for a semiconductor package.

SUMMARY

The present disclosure has been made in an effort to provide a silicon interposer that can reduce the entire area of a semiconductor package and enhance the degree of integration by forming inductors at a lower part of a silicon substrate in addition to an upper part thereof.

An exemplary embodiment of the present disclosure provides a silicon interposer, including: a silicon substrate; an upper inductor layer formed at an upper part of the silicon substrate and a lower inductor layer formed at a lower part of the silicon substrate. The silicon interposer may further include a through silicon via (TSV) configured to penetrate the silicon substrate.

The upper inductor layer may include a first upper dielectric layer formed on an upper surface of the silicon substrate; a first upper metal layer formed on the first upper dielectric layer; a second upper metal layer formed above the first upper metal layer to be spaced apart from the first upper metal layer; a second upper dielectric layer formed on the first upper dielectric layer and configured to separate the first metal layer from the second upper dielectric layer; and a first via configured to electrically connect the first upper metal layer and the second upper metal layer, and the first upper metal layer, the second upper metal layer and the first via may be electrically connected to form an upper inductor.

The lower inductor layer may include a first lower dielectric layer formed on a lower surface of the silicon substrate; a first lower metal layer formed below the first lower dielectric layer; a second lower metal layer formed below the first lower metal layer to be spaced apart from the first lower metal layer; a second lower dielectric layer formed below the first lower dielectric layer and configured to separate the first lower metal layer from the second lower dielectric layer; and a second via configured to electrically connect the first lower metal layer and the second lower metal layer, and the first lower metal layer, the second lower metal layer and the second via may be electrically connected to form a lower inductor.

The upper inductor formed on the upper inductor layer and the lower inductor formed on the lower inductor layer may be electrically connected through the through silicon via.

According to exemplary embodiments of the present disclosure, it is possible to reduce the entire area of a silicon interposer, enhance the degree of integration of a semiconductor package, and reduce manufacturing costs by forming inductors, which occupy a large area in a silicon interposer, on both an upper surface and a lower surface of a silicon substrate.

It is possible to enhance inductance in the same area by electrically connecting upper and lower inductors through a through silicon via (TSV) formed on a silicon substrate, thereby further increasing effects of reducing the area of the silicon interposer and enhancing the degree of integration.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

The above-mentioned objects, features and advantages will be described below in detail with reference to the accompanying drawings so that a person with ordinary skill in the art to which the present disclosure pertains may easily perform the technical ideas of the present disclosure. In the following description, well-known arts will not be described in detail when it is judged that they may unnecessarily obscure the present disclosure. Hereinafter, exemplary embodiments of the present disclosure will be described in detail with reference to the accompanying drawings.

Figure 1:
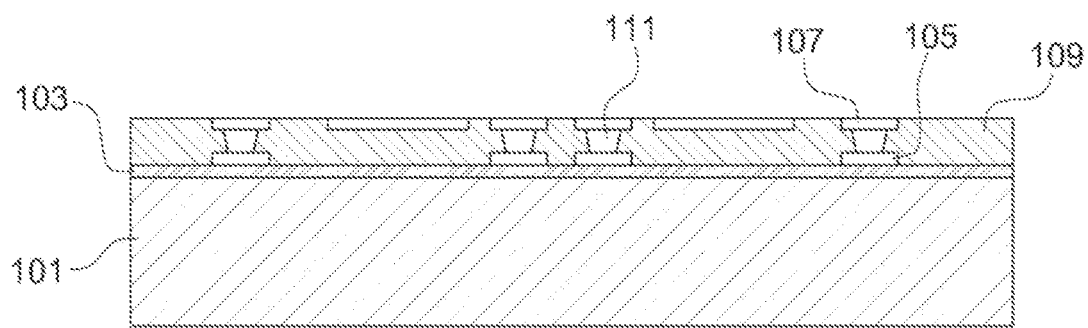
FIG. 1 is a view schematically illustrating a silicon interposer in the related art.
Figure 2:
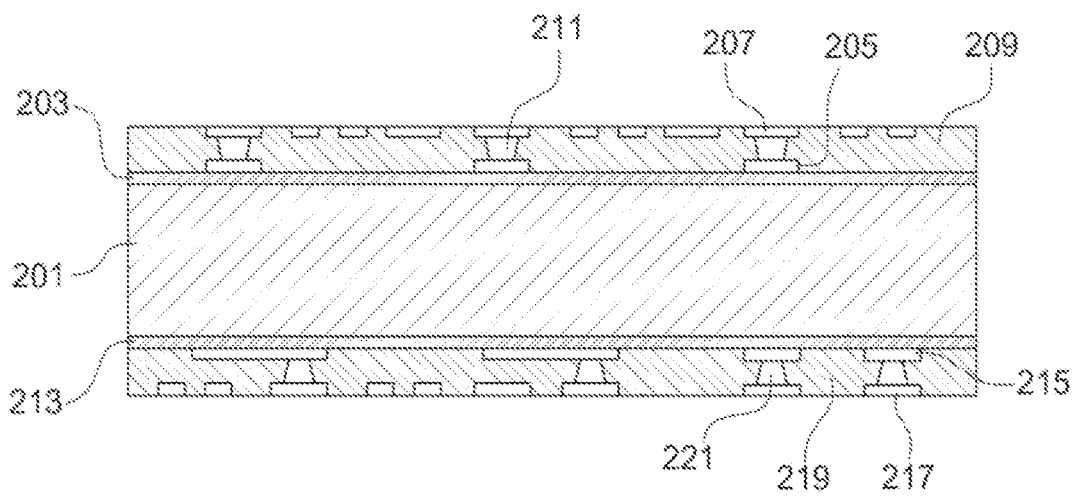
FIG. 2 is a view illustrating a configuration of a silicon interposer according to an exemplary embodiment of the present disclosure.

FIG. 2 is a view illustrating a configuration of a silicon interposer according to an exemplary embodiment of the present disclosure.

Referring to FIG. 2, the silicon interposer according to an exemplary embodiment of the present disclosure includes a silicon substrate 201, an upper inductor layer formed at an upper part of the silicon substrate 201 and a lower inductor layer formed at a lower part of the silicon substrate 201.

The upper inductor layer includes a first upper dielectric layer 203 formed on an upper surface of the silicon substrate 201, a first upper metal layer 205 formed on the first upper dielectric layer 203, a second upper metal layer 207 formed above the first upper metal layer 205 to be spaced apart from the first upper metal layer 205, a second upper dielectric layer 209 formed on the first upper dielectric layer 203 and separating the first upper metal layer 205 from the second upper metal layer 207 and a first via 211 electrically connecting the first upper metal layer 205 and the second upper metal layer 207. The first upper metal layer 205, the second upper metal layer 207 and the first via 211 are electrically connected to form an upper inductor.

The lower inductor layer includes a first lower dielectric layer 213 formed on a lower surface of the silicon substrate 201, a first lower metal layer 215 formed below the first lower dielectric layer 213, a second lower metal layer 217 formed below the first lower metal layer 215 to be spaced apart from the first lower metal layer 215, a second lower dielectric layer 219 formed below the first lower dielectric layer 213 and separating the first lower metal layer 215 from the second lower metal layer 217 and a second via 221 electrically connecting the first lower metal layer 215 and the second lower metal layer 217. The first lower metal layer 215, the second lower metal layer 217 and the second via 221 are electrically connected to form a lower inductor.

Here, the metal layers of the upper and lower inductor layers are formed of multilayers of two or more layers, may be connected through the vias, and may use an insulator having a low dielectric constant so as to obtain a high Q value.

The dielectric layers 203, 209, 213 and 219 may be made of materials such as polyimide, benzocyclobutene (BCB), $SiO_2$ and $Si_3N_4$.

Describing a process of manufacturing the upper inductor, first, the first upper dielectric layer 203 is formed on the upper surface of the silicon substrate 201 and the first upper metal layer 205 is formed thereon by using a metal deposition process or a plating process. Subsequently, the second upper dielectric layer 209 is formed so as to separate the first and second upper metal layers 205 and 207 and the first via 211 is formed so as to electrically connect the first and second upper metal layers 205 and 207. After forming the first via 211, the second upper metal layer 207 is formed by using the metal deposition process or plating process again.

Describing a process of manufacturing the lower inductor, the lower surface of the silicon substrate 201 is etched by a grinding process and a chemical mechanical polishing (CMP) process, thus making the substrate 201 thin. On the lower surface of the thinned substrate 201, the first lower dielectric layer 213 is formed and the first lower metal layer 215 is formed by using a metal deposition process or a plating process. Subsequently, the second lower dielectric layer 219 is formed so as to separate the first and second lower metal layers 215 and 217 and the second via 221 is formed so as to electrically connect the first and second lower metal layers 215 and 217. After forming the second via 221, the second lower metal layer 217 is formed by using the metal deposition process or the plating process again.

A carrier wafer may be used during an etching process for the silicon substrate 201. For example, the silicon substrate 201 which is thinned during various etching and heat treatment processes may be prevented from warping by using a method of, after forming the upper inductor layer, first, bonding the substrate to the carrier wafer, performing processes such as grinding and CMP on the lower surface of the silicon substrate 201, and then separating the carrier wafer again.

Figure 3:
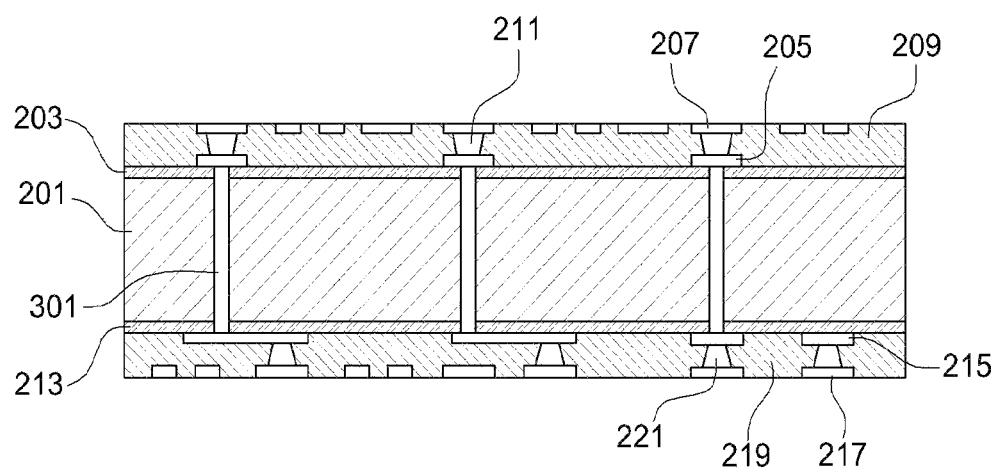
FIG. 3 is a view illustrating a configuration of a silicon interposer according to another exemplary embodiment of the present disclosure.

FIG. 3 is a view illustrating a configuration of a silicon interposer according to another exemplary embodiment of the present disclosure.

Referring to FIG. 3, the silicon interposer according to the other exemplary embodiment of the present disclosure includes a silicon substrate 201, an upper inductor layer formed at an upper part of the silicon substrate 201, a lower inductor layer formed at a lower part of the silicon substrate 201 and a through silicon via 301 penetrating the silicon substrate 201.

Like in FIG. 2, the upper inductor layer includes a first upper dielectric layer 203, a first upper metal layer 205, a second upper metal layer 207, a second upper dielectric layer 209 and a first via 211, and the first upper metal layer 205, the second upper metal layer 207 and the first via 211 are electrically connected to form an upper inductor.

The lower inductor layer includes a first lower dielectric layer 213, a first lower metal layer 215, a second lower metal layer 217, a second lower dielectric layer 219 and a second via 221, and the first lower metal layer 215, the second lower metal layer 217 and the second via 221 are electrically connected to form a lower inductor.

In the exemplary embodiment of the present disclosure, the upper inductor and the lower inductor may be electrically connected through the through silicon via 301 and inductance is increased by an inner metal layer of the through silicon via 301. Therefore, it is possible to reduce an area of the silicon interposer and increase the degree of integration.

The through silicon via 301 may be formed on the silicon substrate 201 by using a reactive ion etch (RIE) or a laser. The through silicon via 301 is filled by using a plating process after forming an isolation layer, a barrier layer and a dielectric layer on the substrate 201 in sequence.

The silicon substrate 201 with the through silicon via 301 is bonded to a carrier wafer by using heat and pressure, and the through silicon via 301 is exposed on the lower surface of the silicon substrate 201 by a grinding process and a CMP process.

When a filled metal is higher than the substrate, planarization work may be performed by a metal CMP process. Inductor layers are formed at an upper part and a lower part of the thinned silicon substrate 201, which is the same as described above with reference to FIG. 2.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A silicon interposer, comprising:
 a silicon substrate;
 an upper inductor layer formed at an upper part of the silicon substrate, the upper inductor layer including an upper inductor;
 a lower inductor layer formed at a lower part of the silicon substrate, the lower inductor layer including a lower inductor;
 a through silicon via (TSV) configured to penetrate the silicon substrate, and to electrically connect the upper inductor and the lower inductor.

2. The silicon interposer of claim 1, wherein the upper inductor layer includes:
 a first upper dielectric layer formed on an upper surface of the silicon substrate;
 a first upper metal layer formed on the first upper dielectric layer;
 a second upper metal layer formed above the first upper metal layer to be spaced apart from the first upper metal layer;
 a second upper dielectric layer formed on the first upper dielectric layer and configured to separate the first upper metal layer from the second upper metal layer; and
 a first via configured to electrically connect the first upper metal layer and the second upper metal layer, wherein
 the first upper metal layer, the second upper metal layer and the first via are electrically connected to form the upper inductor.

3. The silicon interposer of claim 1, wherein the lower inductor layer includes:
 a first lower dielectric layer formed on a lower surface of the silicon substrate;
 a first lower metal layer formed below the first lower dielectric layer;
 a second lower metal layer formed below the first lower metal layer to be spaced apart from the first lower metal layer;
 a second lower dielectric layer formed below the first lower dielectric layer and configured to separate the first lower metal layer from the second lower metal layer; and
 a second via configured to electrically connect the first lower metal layer and the second lower metal layer, wherein
 the first lower metal layer, the second lower metal layer and the second via are electrically connected to form the lower inductor.

4. The silicon interposer of claim 1, wherein the upper inductor layer and the lower inductor layer are formed on opposite sides of the silicon substrate.

* * * * *